(12) United States Patent
Klattenhoff et al.

(10) Patent No.: US 6,404,209 B1
(45) Date of Patent: Jun. 11, 2002

(54) MEASURING INSTRUMENT FOR FILL LEVEL SENSORS

(75) Inventors: Juergen Klattenhoff, Delmenhorst; Guenter Schmitz, Oldenburg; Holger Schroeter, Morsum, all of (DE)

(73) Assignee: Gestra GmbH, Bremen (DE)

( * ) Notice: Subject to any disclaimer, the term of this patent is extended or adjusted under 35 U.S.C. 154(b) by 65 days.

(21) Appl. No.: 09/597,068

(22) Filed: Jun. 20, 2000

(30) Foreign Application Priority Data

Aug. 28, 1999 (DE) .......................................... 199 41 023

(51) Int. Cl.[7] .............................................. G01R 27/00
(52) U.S. Cl. ......................... 324/691; 324/662; 324/673
(58) Field of Search ................................. 324/691, 696, 324/439, 443, 445, 446, 662, 673; 73/304 R

(56) References Cited

U.S. PATENT DOCUMENTS

| | | | | |
|---|---|---|---|---|
| 3,910,118 A | * | 10/1975 | Schittek et al. ............ 73/304 R |
| 4,769,607 A | * | 9/1988 | Bauman et al. .............. 324/446 |
| 5,025,219 A | * | 6/1991 | Gaspard ...................... 324/447 |
| 5,045,797 A | * | 9/1991 | Kramer et al. ............... 324/667 |
| 5,049,826 A | * | 9/1991 | Sasao .......................... 324/662 |
| 5,973,415 A | * | 10/1999 | Brenner et al. .......... 324/686 X |

FOREIGN PATENT DOCUMENTS

DE          25 31 915          1/1977

OTHER PUBLICATIONS

Technische Regeln für Dampfkessel (TRD 604)[Technical Regulations for Steam Boilers], Jan. '77.

* cited by examiner

*Primary Examiner*—N. Le
*Assistant Examiner*—T. R. Sundaram
(74) *Attorney, Agent, or Firm*—Collar & Roe, P.C.

(57) ABSTRACT

A measuring instrument (11) for fill level sensors (4) having a measuring electrode (6) and a compensating electrode (9). The measuring instrument (11) has a bridge circuit whose one bridge branch (21) is formed by two series-connected test resistors (23, 24). The other bridge branch (22) is formed by the measuring resistor (17) on the measuring electrode (6) and the compensating resistor (18) on the compensating electrode (9). Between the two bridge branches (21, 22) a diagonal line (26) with a test switch (27) is provided. The measuring instrument (11) is controlled by the control circuit (13) so that the diagonal line (26) is closed outside of preset test time periods, and interrupted at preset test time periods. The end of the diagonal line (26) located between the two test resistors (23, 24) is connected to the base potential (25) of the measuring circuit (12). The resistors (17, 18, 23, 24) are designed so that when the test switch (27) is closed, the imbalance of the bridge is determined by the second bridge branch (22), whereas when the test switch (27) is open, the imbalance of the bridge is determined by the first bridge branch (21), simulating in this way a situation in which the fill level has dropped below the limit value. The control circuit (13) provides an error signal if the signal of measuring circuit (12) is not corresponding. In this way, the measuring instrument (11) automatically tests its functionality.

6 Claims, 2 Drawing Sheets

MEASURING INSTRUMENT FOR FILL LEVEL SENSORS

BACKGROUND OF THE INVENTION

1. Field of the Invention

The invention relates to a controller for fill level sensors having a measuring electrode and a compensating electrode which both cooperate with a counter electrode for monitoring conditions in which the fill level of an electrically conductive liquid drops below a limit value.

2. The Prior Art

If the fill level of an electrically conducting liquid in a container, such as a steam boiler, drops below a lower limit value, a dangerous operating condition may arise, such as dry firing. The fill level of the liquid therefore has to be monitored in such installations so as to ensure it will not drop below the limit level.

Fill level sensors with a measuring electrode and a compensating electrode are preferably employed for such safety-relevant monitoring processes of the fill level. Both electrodes cooperate with a counter electrode. The measuring electrode serves to actually monitor the fill level. The compensating electrode is present in order to prevent error signals which may otherwise be caused by electrically conducting deposits or coatings that might form on the fill level sensors. As the counter electrode, it is possible to use, for example an electrically conductive tube that surrounds the other two electrodes with a spacing from the two electrodes (U.S. Pat. No. 3,910,118). However, it is also a common practice to let the electrically conductive container function as the counter electrode (DE-PS 25 31 915). The fill level sensors are connected to measuring instruments to produce a fill level signal in the event the fill level drops below the limit value.

In some applications, it is necessary to design the measuring instruments as self-monitoring devices—see, for example the "Technische Regeln für Dampfkessel (TRD 604) [Technical Regulations for Steam Boilers]. The measuring instruments are required to automatically test, at preset time intervals, their capability of reliably producing the corresponding alarm signal if the fill level drops below the limit value.

The invention is concerned with the problem of providing a measuring instrument of the type specified above that has this self-monitoring capability.

SUMMARY OF THE INVENTION

The problem is solved according to the invention by a measuring instrument for fill level sensors having a measuring electrode and a compensating electrode that both cooperate with a counter electrode for monitoring conditions in which the fill level of an electrically conductive liquid drops below a limit value. The device has a measuring circuit and a control circuit connected to the measuring circuit. The measuring circuit connects the measuring electrode, the compensating electrode and the counter electrode. The control circuit produces an alarm signal if the fill level drops below the limit value. The measuring circuit has two series-connected test resistors forming a first branch of a bridge circuit. The measuring electrode, the compensating electrode and the counter electrode are connected to the measuring circuit so that the electrical measuring resistance developed between the measuring electrode and the counter electrode according to the fill level is connected in series with the electrical compensation resistance developed between the compensating electrode and the counter electrode. The two resistors jointly form the second branch of the bridge circuit.

In accordance with the invention, a diagonal line with a test bridge is provided between the two bridge branches. Control means for the test switch is also provided. The control means closes the test switch outside of preset test periods and opens the switch at preset test periods. The end of the diagonal line located between the two test resistors is connected to the base potential of the measuring circuit. The resistors of the bridge circuit are designed so that when the test switch is closed, the second bridge branch produces a signal determining imbalance of the bridge circuit. When the test switch is open, the imbalance of the bridge is determined by the first bridge branch, and a situation in which the fill level drops below the limit value is simulated, whereby the control circuit transmits an error signal if the corresponding signal of the measuring circuit is missing.

The test switch is closed and thus switched to passage while the fill level in the container is being monitored. The measuring resistance developed in the container, as well as the compensation resistance determine the unbalancing and consequently the output signal of the measuring instrument. When the fill level drops below the limit value, the measuring instrument issues a corresponding fill level signal. The measuring instrument also sends a signal if the fill level is above the limit value. The measuring instrument tests at preset time intervals its functionality as to whether an appropriate fill signal could be generated in case the fill level drops below the limit value. The test switch is opened for this purpose. The measurement resistance and the resistance to compensation are then of no importance to the unbalancing of the bridge, which is determined instead by the two test resistors that simulate the condition of "fill level below limit value". It must be possible in the test to produce in the control circuit the fill level signal "short of liquid". If this is not the case, an error is present and the measuring instrument emits a corresponding error signal. The test is not dependent on the conductivity of the liquid in the container.

In another embodiment, the ratio of the resistance values of the test resistors in the first bridge branch is smaller than the ratio of the resistance values of the measuring resistance and the compensating resistance, if both the measuring electrode and the compensating electrode are immersed in the liquid, and the sequence of the higher and lower resistance values in the two bridge branches is reversed. These features have a highly advantageous effect on the generation of a pronounced fill level signal.

In another embodiment, one test resistor has a higher resistance value than the measuring resistor when the measuring electrode is immersed. The other test resistor has a higher resistance than the compensating resistor when the compensating electrode is immersed. The resistance values of the test resistors are sufficiently high so that when the measuring electrode is immersed in the liquid, the second bridge branch dominates the unbalancing of the measuring bridge. These features provide a particularly strong unbalancing of the bridge circuit if the measuring electrode is immersed in the liquid. This strong imbalance is opposite to the unbalancing of the bridge caused by the test resistors. The formation of the signal is independent of any variations or differences that might occur in the supply voltage of the measuring instrument.

In another embodiment, the two bridge branches are connected to each other at their adjacent ends. Means are provided for measuring a first partial bridge voltage between the base potential and a connection on one end of the two bridge branches. Means are also provided for measuring a second partial bridge voltage between the base potential and the connection on the other end of the two bridge branches. In addition, a summing member is provided for adding up the two partial bridge voltages. The control circuit for producing the signal divides the sum of the two partial bridge voltages by the partial bridge voltage measured at the end close to the measuring resistor. The further development of the measuring instrument according to this embodiment offers a particularly advantageous determination of the unbalancing of the bridge and the production of the signal. The received signal is independent of any variations that might occur in the supply voltage of the measuring circuit. The production of the signal with digital means is facilitated as well.

The control of the tests as well as of the signal production can be realized especially advantageously according an embodiment in which the control circuit has an A/D-converter for the incoming signal voltages of the measuring circuit, and a microprocessor for controlling the test switch and for producing the signal.

BRIEF DESCRIPTION OF THE DRAWINGS

Other objects and features of the present invention will become apparent from the following detailed description considered in conjunction with the accompanying drawings. It is to be understood, however, that the drawings are designed as an illustration only and not as a definition of the limits of the invention.

In the drawings, wherein similar reference characters denote similar elements throughout the several views.

DETAILED DESCRIPTION OF PREFERRED EMBODIMENTS

Figure 1:
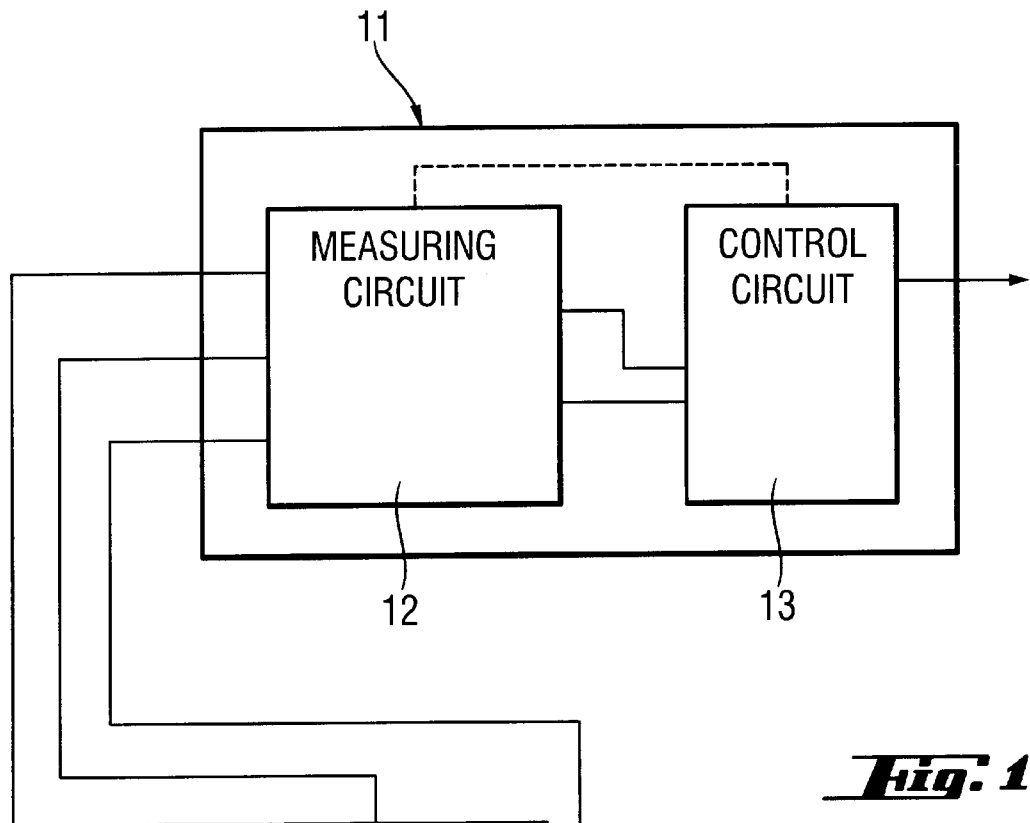
FIG. 1 shows the measuring instrument, which is connected to the fill level sensor of a container.

FIG. 1 shows a container 1, in which the fill level 2 of an electrically conductive fluid 3 is to be monitored with a fill level sensor 4. Fill level sensor 4 has a measuring electrode 6 disposed into container 1 up to a preset lower limit value 5. Within the vicinity of the container wall 7, measuring electrode 6 is surrounded by an insulator 8, which in turn is surrounded by a compensating electrode 9. Compensating electrode 9 is electrically insulated from measuring electrode 6 by insulator 8, on the one hand, and from container wall 7 by another insulator 10 on the other.

The electronic measuring instrument 11 has a measuring circuit 12 and a control circuit 13. Measuring circuit 12 is connected in an electrically conductive way to measuring electrode 6 via a first line 14, and to compensating electrode 9 of fill level sensor 4 via a second line 15. Container wall 7 is metal and functions as the counter electrode for measuring electrode 6 and compensating electrode 9. For this purpose, it is connected to measuring circuit 12 by way of a third line 16.

In accordance with the surrounding medium, which may be a liquid or a gaseous medium, an electrical measuring resistance 17 develops between measuring electrode 6 and container wall 7, and a compensation resistance 18 between the compensating electrode 9 and container wall 7. The resistances are shown in FIG. 1 by the dashed lines.

Figure 2:
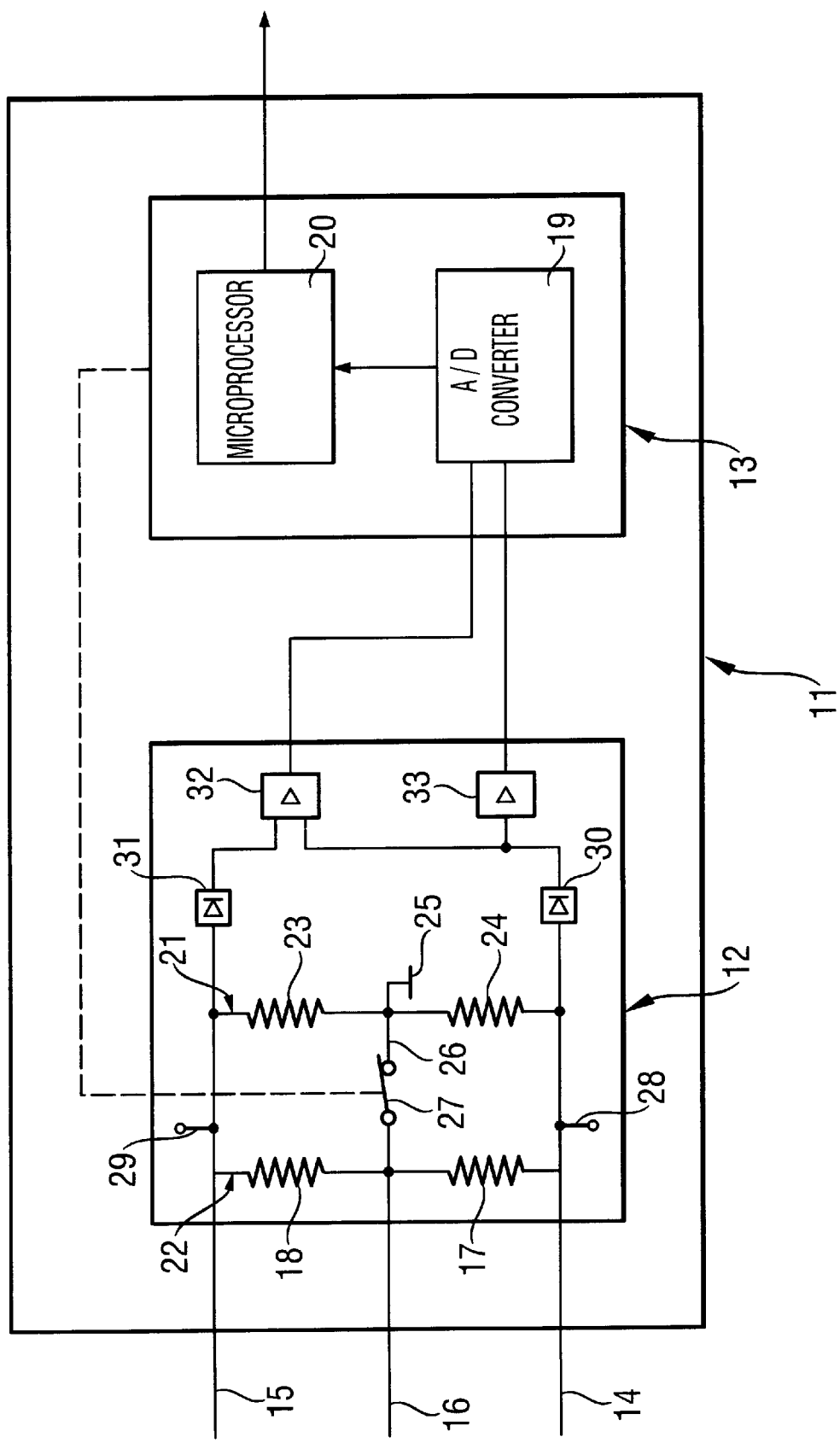
FIG. 2 is a detailed representation of the measuring instrument.

Control circuit 13 has an analog-to-digital converter 19 and a microprocessor 20 as shown in FIG. 2, the output of which produces the alarm signals. Measuring circuit 12 has a bridge circuit with two bridge branches 21, 22. Two test resistors 23, 24 are connected in series in first bridge branch 21. The junction between the two test resistors 23, 24 is connected to the base potential 25 of measuring circuit 12. Lines 14, 15, 16 are connected to measuring circuit 12 so that measuring resistor 17 and compensating resistor 18 are connected in series and jointly form second bridge branch 22. The two bridge branches 21, 22 are connected to each other via a diagonal line 26 at the connections of their two resistors 17, 18; 23, 24, and thus in the center. The diagonal line is provided with a test switch 27, which is actuated by control circuit 13, as shown by the dotted line connection. Furthermore, the two bridge branches 21, 22 are connected to each other at their ends, and to an ac voltage source (not shown) via the power supply lines 28, 29. A rectifier component or diode 30, 31 is connected to each of the two ends of first bridge branch 21. Each rectifier or diode 30, 31 measures the bridge partial voltage between the respective end of bridge branch 21 and base potential 25, and forms a corresponding dc voltage. The dc voltages of both rectifier members 30, 31 are added and amplified in a first operational amplifier 32 connected at the output, as the summing amplifier. The dc voltage of rectifier member 30, which is connected to the end of bridge branch 21 located adjacent to measuring resistor 17, is amplified separately in a second operational amplifier 33, namely by the same factor as the other dc voltage.

The surface area of measuring electrode 6 within container 1 is distinctly larger than the surface area of compensating electrode 9. Compensating resistor 18 is therefore distinctly larger than measuring resistor 17. The same applies if measuring electrode 6 alone is immersed in fluid 3, but also if compensating electrode 9 should be immersed in fluid 3 as well, or if compensating electrode 9 has electrically conductive coatings or deposits. Fluid 3 in container 1 has a substantially higher electrical conductivity than the gaseous medium located on top of the fluid, e.g. air or steam.

The resistance values of the two test resistors 23, 24 have a ratio with respect to each other that is smaller than the ratio between the resistance values of measuring resistor 17 and compensating resistor 18. This relates to their ratio if both measuring electrode 6 and compensating electrode 9 are immersed in fluid 3. In first bridge branch 21, however, the sequence of the higher/lower resistance value is opposite from the sequence of the resistance values in second bridge branch 22. As mentioned before, in second bridge branch 22, measuring resistor 17 has the lower value and the compensating resistor the higher value. In first bridge branch 21, on the other hand, test resistor 24 connected in parallel with measuring resistor 17 has the higher resistance value of the two test resistors 23, 24. In other words: the test resistance 24 is greater than the test resistance 23 by a factor that is smaller than the factor by which compensating resistor 18 is greater than measuring resistor 17.

Fill level 2 in container 1 is to be monitored with respect to whether it drops below a preset lower limit value 5. To monitor fill level 2, test switch 27 is closed by control circuit 13, which is controlled by microprocessor 20. If fill level 2 is above limit value 5, measuring resistance 17 developed between measuring electrode 6 and container wall 7 is lower than compensating resistance 18 developed between compensating electrode 9 and container wall 7. Furthermore, measuring resistance 17 is by that much lower than test resistances 23, 24, and the ratio of measuring resistance 17 to compensating resistance 18 is by that much higher than the ratio of test resistances 23, 24, that second bridge branch 22 dominates in the unbalancing of the bridge. It causes unbalancing of the bridge with a low bridge partial voltage on rectifier 30, and a high bridge partial voltage on rectifier 31. Corresponding voltage signals are received from rectifiers 30 and 31 via operational amplifiers 32, 33 in control circuit 13. In A/D-converter 19, digital values are produced based on the analog voltage signals of measuring circuit 12, and microprocessor 20 produces from the digital values, a fill level signal "fill level adequate". For this purpose, the sum of both partial voltages produced by operational amplifier 32 is divided by the voltage signal received on operational amplifier 33. The production of the signal is not influenced by any variations that might occur in the supply voltage fed via supply lines 28, 29.

If fill level 2 in container 1 drops below limit value 5, measuring electrode 6 has emerged from liquid 3. Measuring resistor 17 and compensating resistor 18 consequently assume very high resistance values. These resistance values are sufficiently above the resistance values of test resistors 23, 24 that first bridge branch 21 now dominates. Since test resistor 23 has the lower and test resistor 24 has the higher resistance value, bridge branch 21 effects an opposite unbalancing of the bridge. The bridge partial voltage received on rectifier member 30 is then higher than the one applied to rectifier member 31. Control circuit 13 thereupon issues the fill level signal "lack of fluid".

Measuring instrument 11 periodically and automatically tests its functionality as to whether in the event the fill level drops below the limit value, the corresponding fill level signal can be reliably issued. The test is carried out as long as fill level 2 does not drop below limit value 5, thus as long as the level is not below the limit value. This condition is tested by control circuit 13 via microprocessor 20 prior to the function test.

For the function test, test switch 27 is controlled by control circuit 13 so that it reverses from the position "switch closed" to the position "switch open" for a preset test duration. While diagonal line 26 is interrupted, second bridge branch 22 has no influence on the unbalancing of the bridge. The balance of the bridge is determined during the test solely by first bridge branch 21. As stated above, first bridge branch 21 simulates the condition "fill level below limit value", which accordingly leads to a higher bridge partial voltage on rectifier 30 and to a lower bridge partial voltage on rectifier 31. The voltage signals received from there via operational amplifiers 32, 33 in control circuit 13 are evaluated by microprocessor 20. If the evaluation carried out internally in control circuit 13 leads to the adequate fill level signal "lack of fluid", test switch 27 is controlled by control circuit 13 after the end of the test duration so that it closes again, and monitoring of fill level 2 is continued. No fill level signal "lack of fluid" is issued by control circuit 13 in the course of the short test. However, if the fill level signal "lack of fluid" is not generated in control circuit 13 during the test, an error is present in measuring instrument 11, and control circuit 13 issues an error signal. Any safety-relevant malfunctions that may have occurred in measuring instrument 11 are detected in this way.

While several embodiments of the present invention have been shown and described, it will be obvious that many changes and modifications may be made thereunto without departing from the spirit and scope of the invention.

What is claimed is:

1. A measuring instrument for monitoring fill level sensors having a measuring electrode and a compensating electrode, with a counter electrode cooperating with the measuring electrode and the compensating electrode to monitor conditions in which a fill level of an electrically conductive liquid drops below a limit value, which comprises:

(a) a measuring circuit connected to the measuring electrode, the compensating electrode and the counter electrode, said measuring circuit comprising a base potential and first and second series-connected test resistors forming a first branch of a bridge circuit, said first test resistor having a greater resistance than said second test resistor by a first amount, the measuring electrode, the compensating electrode and the counter electrode being connected to the measuring circuit so that an electrical measuring resistor formed between the measuring electrode and the counter electrode according to the fill level is connected in series with an electrical compensating resistor formed between the compensating electrode and the counter electrode, the electrical measuring resistor and the electrical compensating resistor forming a second branch of the bridge circuit, said electrical compensating resistor having a greater resistance than said electrical measuring resistor by a second amount, the sequence of the higher and lower resistance values in the two bridge branches being different from each other and the first amount being smaller than the second amount;

(b) a diagonal line comprising a test switch between the first and second bridge branches, said diagonal line having an end between the test resistors ox said first bridge branch connected to the base potential of the measuring circuit; and (c) a control circuit connected to the measuring circuit for causing an alarm signal if the fill level drops below the limit value, said control circuit comprising a controller for the test switch, said controller closing the test switch outside of preset test time periods and opening the test switch during preset test time periods, wherein the first amount is sufficiently smaller than the second amount so that when the test switch is closed, the second bridge branch determines whether the bridge circuit is balanced or unbalanced, and when the test switch is open, the first bridge branch determines whether the bridge circuit is balanced or unbalanced and produces an imbalance in the bridge circuit simulating a situation in which the fill level drops below the limit value, the measuring circuit generating a fill level signal in accordance with whether the bridge circuit is balanced or unbalanced and the control circuit transmitting an error signal if the measuring circuit fails to issue a fill level signal indicating a fill level below the limit value when the test switch is open.

2. The arrangement according to claim 1, wherein:

the ratio of the resistance values of the test resistors in the first bridge branch is smaller than the ratio of the resistance values of the measuring resistor and the compensating resistor if the measuring electrode and the compensating electrode both are immersed in the liquid.

3. The arrangement according to claim 2, wherein:

(a) the first test resistor has a higher resistance value than the measuring resistor when the measuring electrode is immersed;

(b) the second test resistor has a higher resistance value than the compensating resistor when the compensating electrode is immersed; and (c) the resistance values of the test resistors are sufficiently higher that when the measuring electrode is immersed in the liquid, the second bridge branch dominates the unbalancing of the measuring bridge.

4. The arrangement according to claim 1, wherein the two bridge branches are connected to each other at their adjacent ends; and the arrangement further comprises:

(a) means for measuring a first partial bridge voltage between the base potential and a first connection on one end of the two bridge branches;

(b) means for measuring a second partial bridge voltage between the base potential and a second connection on the other end of the two bridge branches;

(c) a summing member for adding up the two partial bridge voltages; and wherein the control circuit, in causing the alarm signal, divides the sum of the two partial bridge voltages by the partial bridge voltage measured at the end close to the measuring resistor.

5. The arrangement according to claim 1, wherein the said control circuit comprises an A/D-converter for measuring incoming signal voltages of the measuring circuit, and a microprocessor for controlling the test switch and for causing the alarm signal.

6. A measuring instrument for fill level sensors monitoring conditions in which a fill level of an electrically conductive liquid drops below a limit value, which comprises:

(a) a measuring circuit connected to the fill level sensor comprising a base potential and a bridge circuit, said bridge circuit comprising a first bridge branch formed by first and second series-connected test resistors and a second bridge branch formed by an electrical measuring resistor and an electrical compensating resistor, said first test resistor having a greater resistance than said second test resistor by a first amount, said electrical compensating resistor having a greater resistance than said electrical measuring resistor by a second amount, the sequence of the higher and lower resistance values in the two bridge branches being different from each other and the first amount being smaller than the second amount;

(b) a diagonal line comprising a test switch between the first and second bridge branches, said diagonal line having an end between the test resistors of said first bridge branch connected to the base potential of the measuring circuit;

(c) a control circuit connected to the measuring circuit for causing an alarm signal if the fill level drops below the limit value, said control circuit closing the test switch outside of preset test time periods and opening the test switch during preset test time periods, wherein the first amount is sufficiently smaller than the second amount so that when the test switch is closed, the second bridge branch determines whether the bridge circuit is balanced or unbalanced, and when the test switch is open, the first bridge branch determines whether the bridge circuit is balanced or unbalanced and produces an imbalance in the bridge circuit simulating a situation in which the fill level drops below the limit value, the measuring circuit generating a fill level signal fin accordance with whether the bridge circuit is balanced or unbalanced and the control circuit transmitting an error signal if the measuring circuit fails to issue a fill level signal indicating a fill level below the limit value when the test switch is open.

* * * * *

UNITED STATES PATENT AND TRADEMARK OFFICE
CERTIFICATE OF CORRECTION

PATENT NO. : 6,404,209 B1
DATED : June 11, 2002
INVENTOR(S) : J. Klattenhoff et al.

It is certified that error appears in the above-identified patent and that said Letters Patent is hereby corrected as shown below:

Column 6,
Line 29, please change "ox" to -- of --.

Signed and Sealed this

Twenty-first Day of January, 2003

JAMES E. ROGAN
*Director of the United States Patent and Trademark Office*